United States Patent [19]

Miyata et al.

[11] Patent Number: 5,453,694
[45] Date of Patent: Sep. 26, 1995

[54] SNAP-IN TYPE SPARKPLUG VOLTAGE PROBE DEVICE FOR USE IN INTERNAL COMBUSTION ENGINE

[75] Inventors: Shigeru Miyata; Yoshitaka Yamada; Hideji Yoshida; Yoshihiro Matsubara; Yasuo Ito, all of Nagoya, Japan

[73] Assignee: NGK Spark Plug Co., Ltd., Nagoya, Japan

[21] Appl. No.: 262,655

[22] Filed: Jun. 20, 1994

Related U.S. Application Data

[62] Division of Ser. No. 982,822, Nov. 30, 1992.

[30] Foreign Application Priority Data

Nov. 28, 1991 [JP] Japan ............... 3-314783
Nov. 29, 1991 [JP] Japan ............... 3-316685
May 11, 1992 [JP] Japan ............... 4-117683
Nov. 13, 1992 [JP] Japan ............... 4-303859

[51] Int. Cl.$^6$ ............ F02P 17/00; G01R 1/06; G01R 15/00; G01R 19/165
[52] U.S. Cl. ............ 324/402; 324/126; 324/149; 324/393
[58] Field of Search ............ 324/72.5, 126, 324/388, 392, 402, 548, 457, 395, 393, 149; 73/116, 117.3

[56] References Cited

U.S. PATENT DOCUMENTS

| 2,408,045 | 9/1946 | Cottrell | 324/402 |
| 4,090,130 | 5/1978 | Willenbecher | 324/126 |
| 4,547,734 | 10/1985 | Spaude | 324/395 |
| 5,218,302 | 6/1993 | Loewe et al. | 324/402 |
| 5,237,278 | 8/1993 | Bumen | 324/402 |
| 5,307,017 | 4/1994 | Maruyama et al. | 324/402 |
| 5,317,267 | 5/1994 | Miyata et al. | 324/402 |
| 5,317,268 | 5/1994 | Maruyama et al. | 324/402 |

Primary Examiner—Sandra L. O'Shea
Assistant Examiner—J. Patidar
Attorney, Agent, or Firm—Cooper & Dunham

[57] ABSTRACT

In a snap-in type spark plug voltage probe device, the insulator base has an upper half and a lower half, both ends of which are integrally connected by means of a flexible portion. The upper half and the lower half have a plurality of grooves in which spark plug cables are placed. The upper half and the lower half are joined together by the flexible portion when in a closed position. The upper half has an opening to receive a protrusion provided on the lower half of the insulator base to maintain the upper half of the insulator base along the grooves, providing static capacity between the electrode layer and the spark plug cables when voltage is applied across the spark plugs. A lead wire electrically connects the electrode layer to a microcomputer so as to analyze the burning condition based on the static capacity between the electrode layer and the spark plug cables. An electrical shield layer is embedded in the insulator base in the proximity of the electrode layer and connected to the internal combustion engine by way of a ground wire located at a side of the electrode layer remote from the grooves so as to electrically shield the electrical layer. An insulator sheet is embedded in the insulator base and located between the electrode layer and the electrical shield layer.

6 Claims, 24 Drawing Sheets

SNAP-IN TYPE SPARKPLUG VOLTAGE PROBE DEVICE FOR USE IN INTERNAL COMBUSTION ENGINE

This is a division of application Ser. No. 982,822, filed Nov. 30, 1992 pending.

BACKGROUND OF THE INVENTION

1. Field of the Invention

This invention relates to a snap-in type spark plug voltage probe device which is applied to a spark plug to detect faulty firing in an internal combustion engine.

2. Description of Prior Art

With the demand of purifying emission gas and enhancing fuel efficiency of internal combustion engine, it has been necessary to detect firing condition in each cylinder of the internal combustion engine so as to protect the internal combustion engine plug against misfire. In order to detect the firing condition in each of the cylinders, an optical sensor has been installed within the cylinders on one hand. On the other hand, a piezoelectrical sensor has been attached to a seat pad of the spark plug.

In those prior art counterparts, it is troublesome and time-consuming to install the sensor to each of the cylinders, thus increasing the installation cost, and at the same time, taking much time in check and maintenance.

Therefore, it is one of the objects of the invention to provide a sparkplug voltage probe device in an internal combustion engine which is capable of precisely detecting a voltage applied to the spark plug installed to each cylinder of the internal combustion engine with a relatively simple structure.

SUMMARY OF THE INVENTION

According to the invention, a substantially uniform static capacity is formed between an insulator base and spark plug cables so that it is sufficient to detect a sparkplug voltage in each of the cylinders in the combustion engine with a single sparkplug voltage probe device. The use of an electrical shield sheet makes it possible to prevent a static capacity from occurring between an electrode plate and the perimeter parts of the engine when mounted on the engine, thus avoiding sensitivity variation of the sparkplug voltage probe device depending on where the probe device is mounted on the engine.

According further to the invention, a substantially uniform static capacity is formed between each of sparkplug cables and corresponding grooves of an electrode plate, so that a substantially constant level of sparkplug voltage is obtained in each cylinder of the internal combustion engine, thus making it possible to precisely detect a burning condition in the internal combustion engine.

According furthermore to the invention, with the use of an electrical shield sheet, it is possible to prevent a static capacity from occurring between an electrode plate and the perimeter of the engine when mounted on the engine, thus avoiding sensitivity variation of the sparkplug voltage probe device depending on where the probe device is mounted on the engine. An adhesive filler is provided between an upper half and a lower half of an insulator base, thus preventing an entry of water into the insulator base to avoid capacity change between the sparkplug cables and an electrode plate so as to prevent a faulty voltage from being detected by the probe device.

According further to the invention, a static capacity ($C_2$) is formed between an electrode plate and a conductor wall, the static capacity ($C_2$) is greater than a static capacity ($C_1$) formed between the electrode plate and sparkplug cables. The noise level (N), which otherwise would disturb the electrode plate, is reduced by the ratio of ($C_1/C_2$) so as to supress an interference in detecting a signal (S) which is outputted from the sparkplug voltage probe device. This is because the noise voltage applied to the electrode plate is divided by the order of ($C_1/C_2$). With electrical circuit boards accommodated into an electrical shield casing and an electrode plate covered by an electrical shield sheet, it is possible to prevent electromagnetical noise from interfering with the electrode plate and electrical circuits when the noise appears due to a high voltage in an ignition system. This makes it possible to reduce the ratio of S/N so as to precisely detect a voltage applied to a spark plug. With the use of a rubber plate, it is possible to prevent the vibration of the engine from transmitting to the circuit boards. With an integral lamination of the shield casing, the insulator base, the rubber plate and the shield sheet, it is possible to readily mount the probe device on the internal combustion engine.

These and other objects and advantages of the invention will be apparent upon reference to the following specification, attendant claims and drawings.

DETAILED DESCRIPTION OF THE EMBODIMENTS

Figure 1:
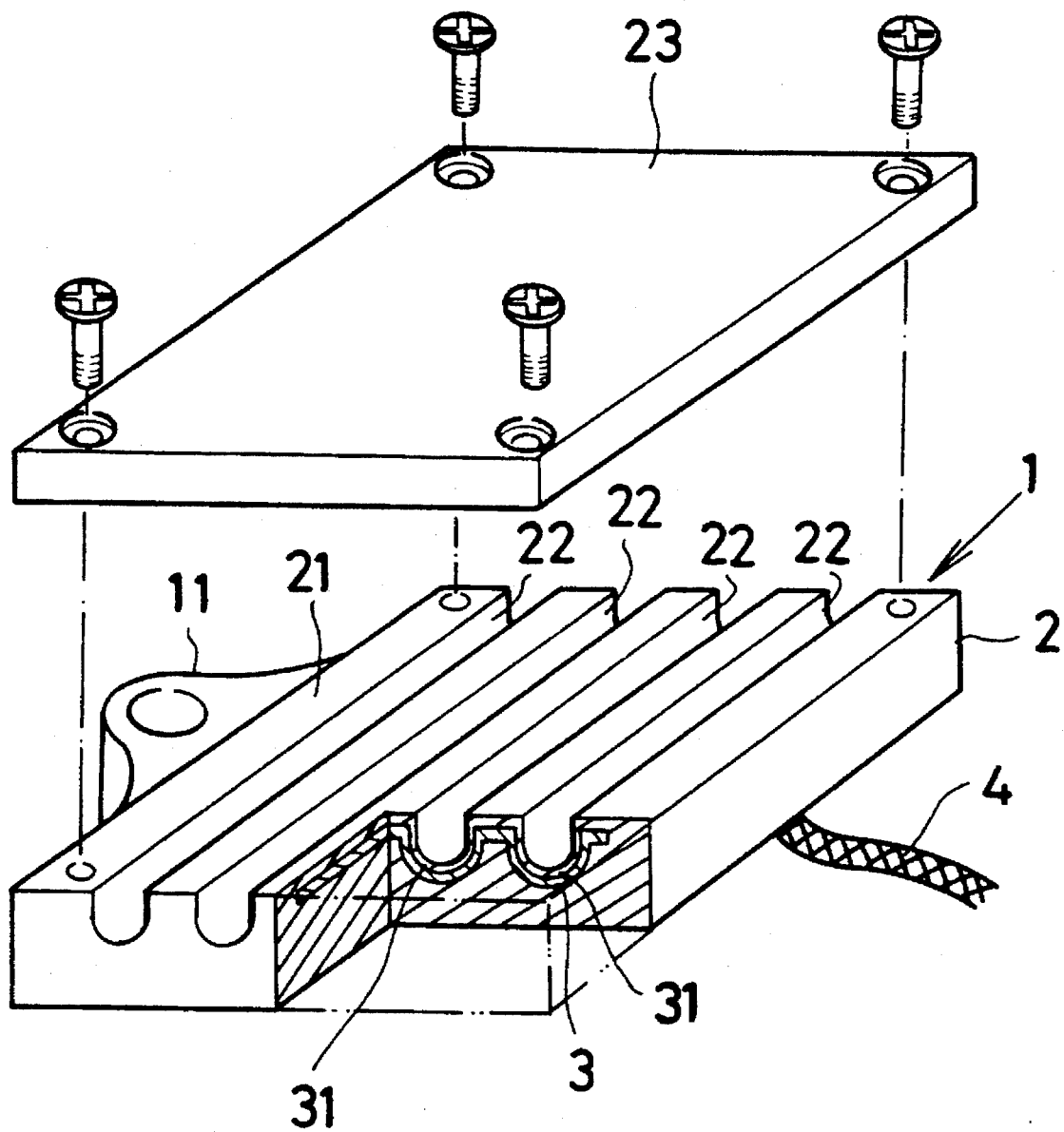
FIG. 1 is a perspective exploded view of a sparkplug voltage probe device according to a first embodiment of the invention.

Referring to FIG. 1 which shows a sparkplug voltage probe device 1 in an internal combustion engine according to a first embodiment of the invention, an insulator base 2 has a rectangular upper surface 21 on which a plurality of grooves 22 are provided at regular intervals in a longitudinal direction. Each of the grooves 22 are U-shaped in section. Each diameter of the grooves 22 corresponds to that of sparkplug cables (HC), and the number of the grooves 22 corresponds to that of cylinders of the internal combustion engine. Along the grooves 22, an electrode plate 3 is embedded in the insulator base 2. The electrode plate 3 is in the form of a corrugated configuration which has channels 31 corresponding to the grooves 22 of the insulator base 2. The electrode plate 3 is embedded in the insulator base 2 at the time when the insulator base 2 is formed by means of injection mould, and electrode plate 3 is electrically connected to a microcomputer as described hereinafter. An anchor block 11 is moulded at a side wall of the insulator base 2.

Figure 2:
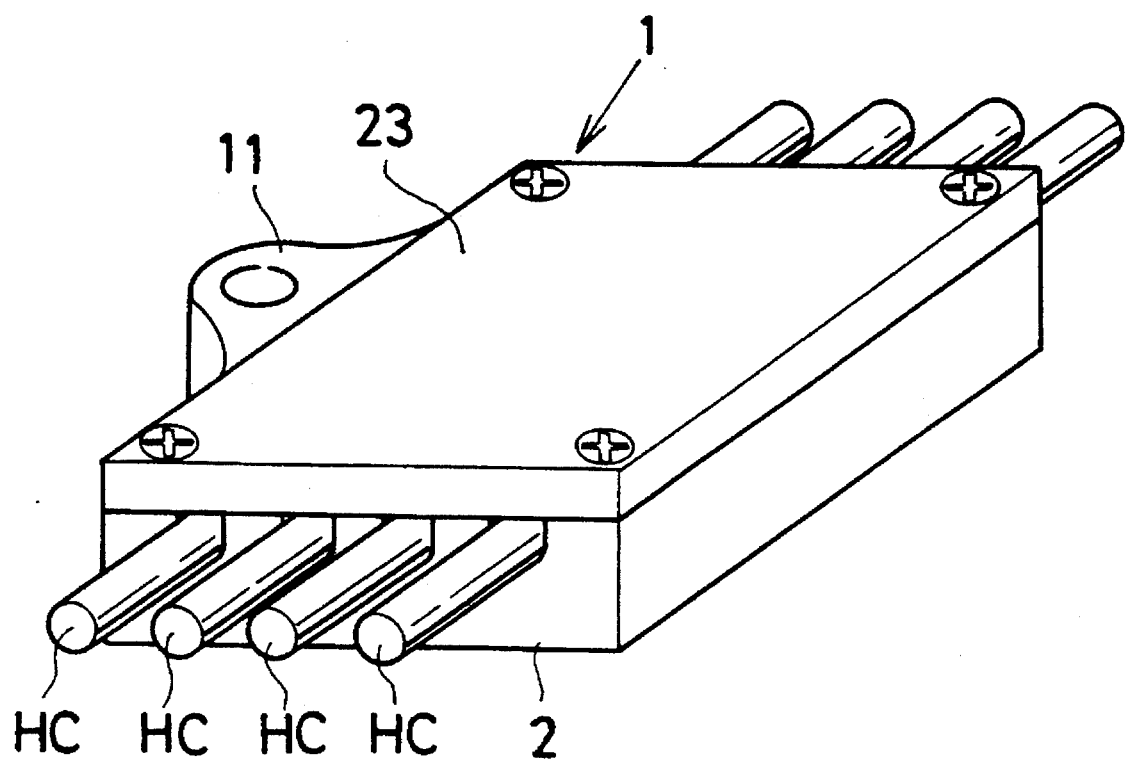
FIG. 2 is a perspective view of the sparkplug voltage probe device.
Figure 3:
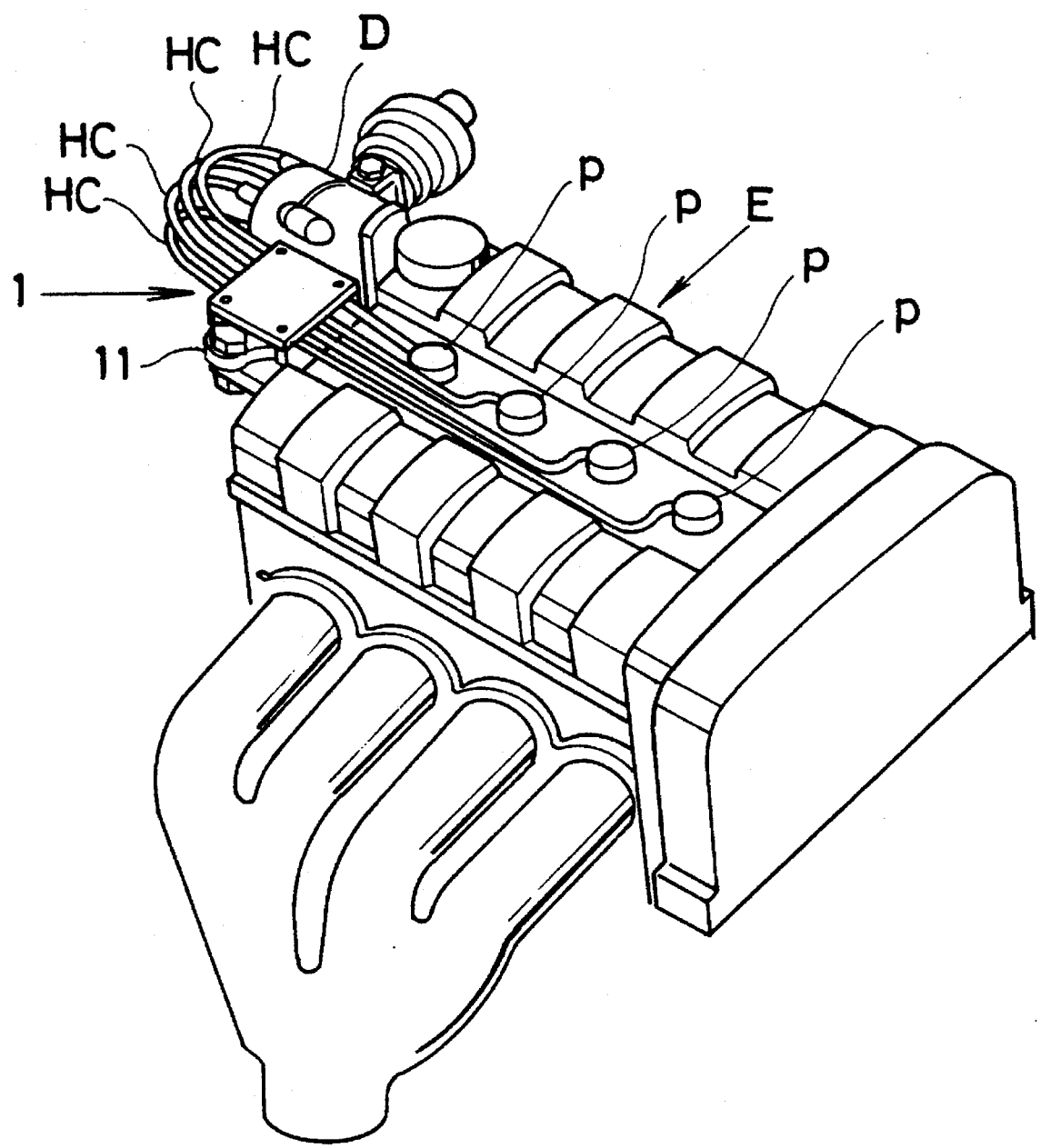
FIG. 3 is a perspective view with the sparkplug voltage probe device mounted on an internal combustion engine.

In each of the grooves 22, is a cable (HC) located to form a static capacity (e.g. 1 pF) between the electrode plate 3 and the cables (HC) as shown in FIG. 2. On the upper surface 21 of the insulator base 2, is a lid 23 placed to secure each of the cables (HC) against removal. Then the sparkplug voltage probe device 1 is mounted on an internal combustion engine (E) by securing the anchor block 11 to a cylinder head of the internal combustion engine (E), and collects the cables (HC) to introduce them to a distributor (D) as shown in FIG. 3.

Figure 4:
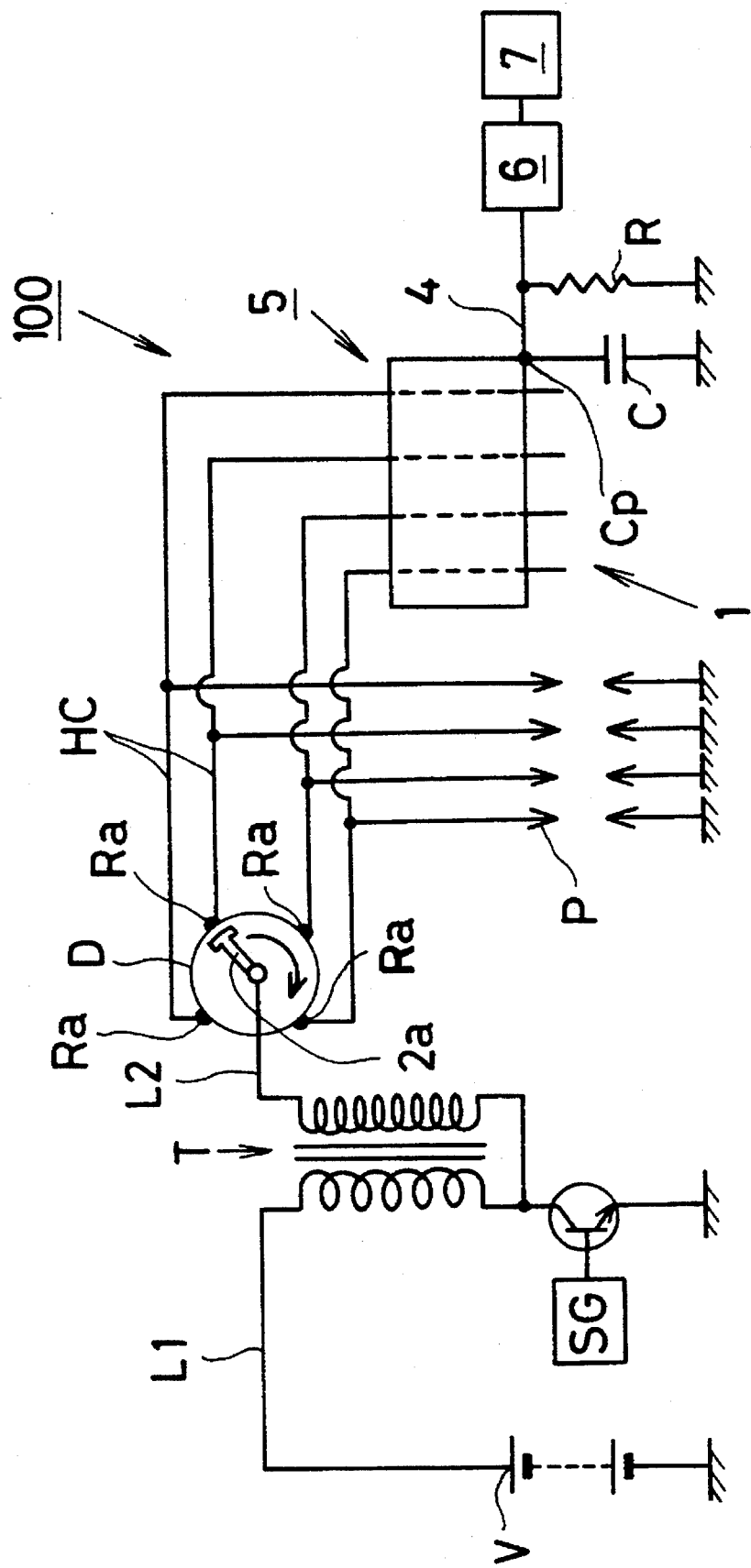
FIG. 4 is a schematic view of an ignition system incorporated into the internal combustion engine.

FIG. 4 shows an ignition system 100 which is incorporated into the internal combustion engine (E). The ignition system has an ignition coil (T) having a primary coil (L1) and a secondary coil (L2). In series with the primary coil (L1), are a vehicular battery cell (V) and a signal generator (SG) connected. Each of the cables (HC) has one end connected to the secondary coil () through a rotor 2A of the distributor (D), and having the other end connected to a voltage divider circuit 5 as described hereinafter. By way of an example, the distributor (D) has four stationary segment (Ra). To each of the stationary segments (Ra), a free end of the rotor 2a approaches to make a series gap with the corresponding segments (Ra) during the rotary movement of the rotor 2a. To each of the four stationary segments (Ra), is a spark plug (P) electrically connected by way of the corresponding cables (HC). Each of the spark plugs (P) is electrically connected to the ground so that the secondary coil (L2) energizes each of the spark plugs (P) by way of the cables (HC), the rotor 2a and the stationary segment (Ra) of the distributor (D).

A common point (Cp) between the electrode plate 3 and the lead wire 4, is grounded by way of a capacitor C (3000 pF) to form the voltage divider circuit 5. In parallel with the capacitor (C), is an electrical resistor R (e.g. 3 MΩ) connected to form a discharge circuit for the capacitor (C). The voltage divider circuit 5 divides a sparkplug voltage by the order of 1/3000 to make a time constant of RG path 9 milliseconds, thus making it possible to observe a relatively slow change of the sparkplug voltage.

Meanwhile, the lead wire 4 is connected to a sparkplug voltage waveform detector circuit 6. The circuit 6 is connected to a distinction circuit (microcomputer) 7 which analyses a burning condition in the internal Combustion engine (E) on the basis of the waveform outputted from the circuit 6 as described hereinafter.

The sparkplug voltage waveform detector circuit 6 analyses a divided voltage waveform generated from the voltage divider circuit 5, and compares the characteristics of the divided voltage waveform with data determined by experiment.

The divided voltage waveform is analogous to that of the sparksplug voltage, and changes depending upon the case in which an air-fuel mixture is normally ignited, and the case in which the air-fuel mixture is not ignited although a spark is established by the spark plug (P). The divided voltage waveform also changes depending upon the smoking of the spark plug (P), deterioration of the ingition coil (T) and a shortage of the vehicular battery cell (V).

Analysis of the divided voltage waveform makes it possible to distinguish the normal ignition from the accidental misfire and misspark.

Figure 5:
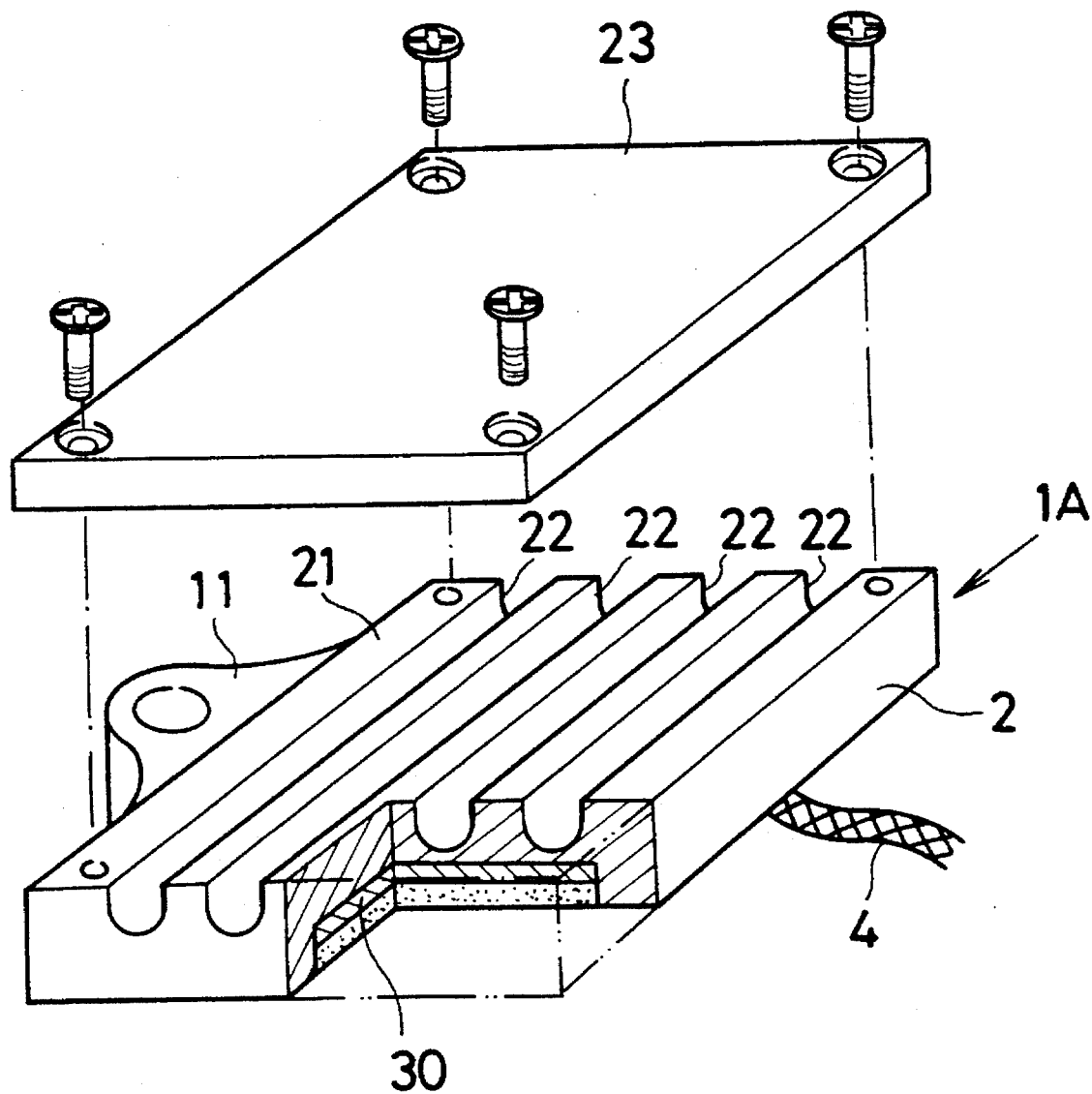
FIG. 5 is a view similar to FIG. 1 according to a second embodiment of the invention.
Figure 6:
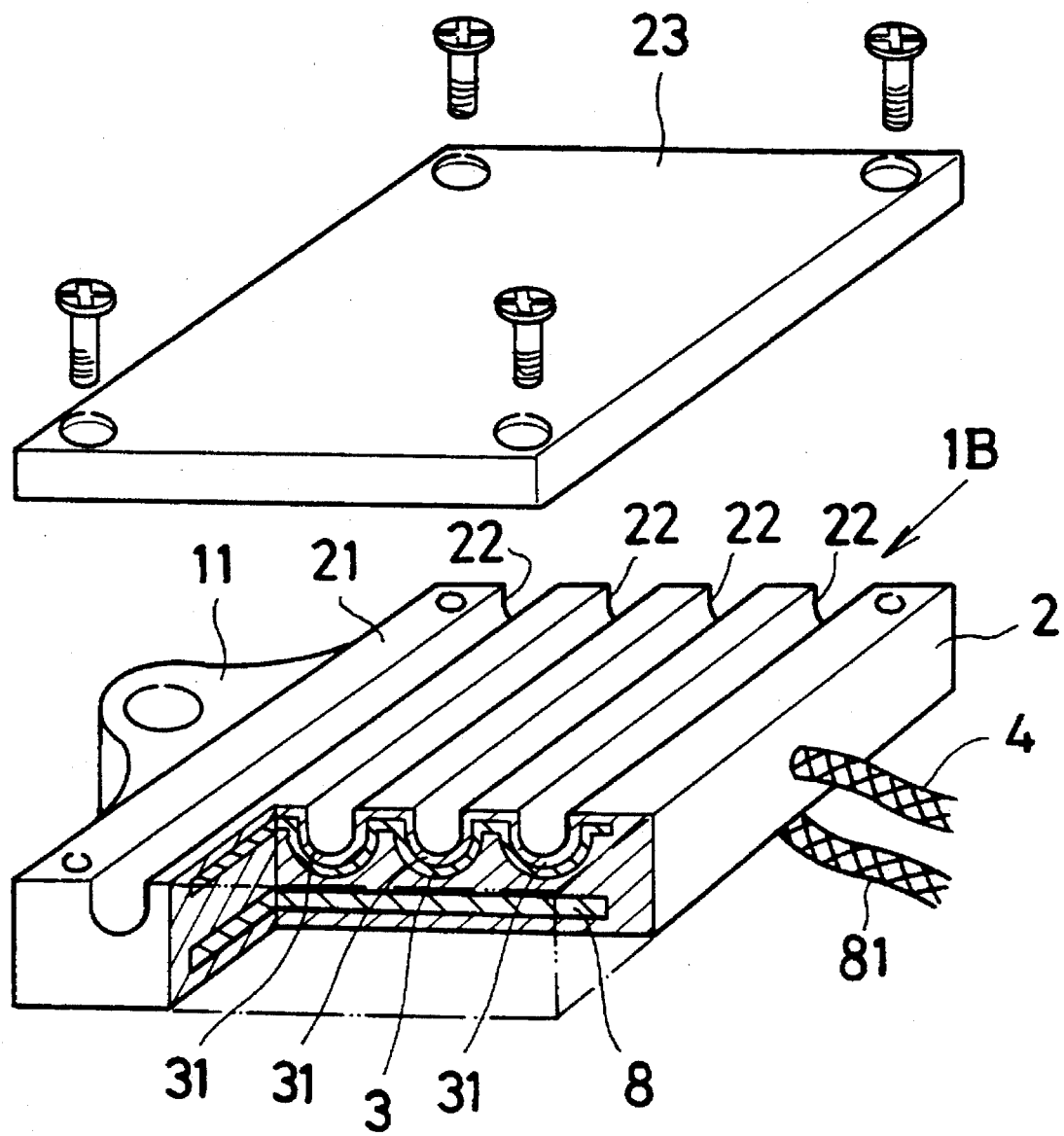
FIG. 6 is a view similar to FIG. 1 according to a third embodiment of the invention.

FIG. 5 shows a second embodiment of the invention in which a sparkplug voltage probe device 1A has a flat electrode plate 30 instead of the corrugated configuration. Due to a simple structure of the flat electrode plate 30, the plate 30 is readily embedded in the insulator base 2.

Figure 8:
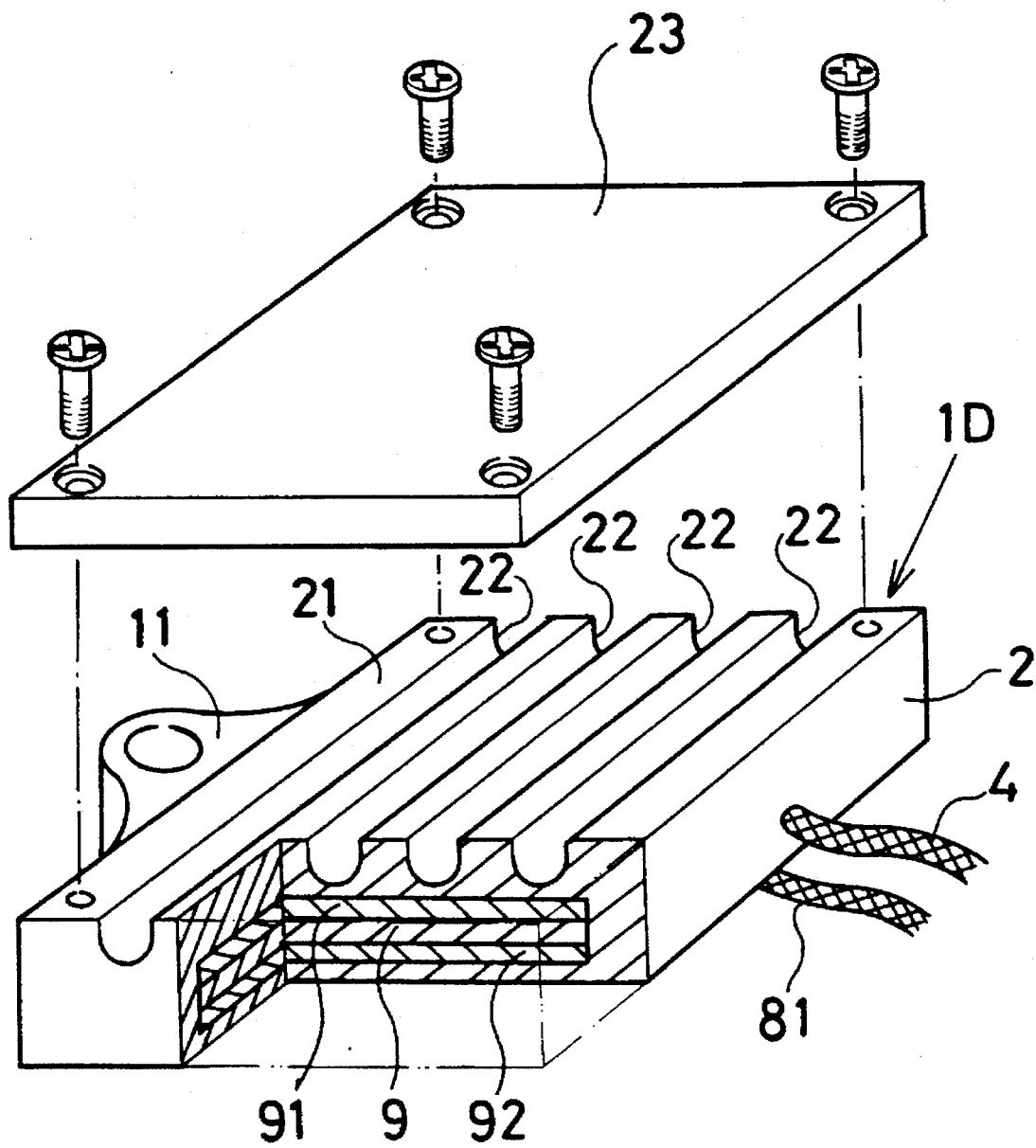
FIG. 8 is a view similar to FIG. 1 according to a fifth embodiment of the invention.

FIG. 8 shows a third embodiment of the invention in which a sparkplug voltage probe device 1B has an electrical shield sheet 8 embedded in the insulator base 2 of the first embodiment to be located under the electrode plate 3. The electrical shield sheet 8 is connected to the internal combustion engine (E) by way of a ground wire 81 so as to equalize the potential level to the level of the internal combustion engine (E).

Figure 7:
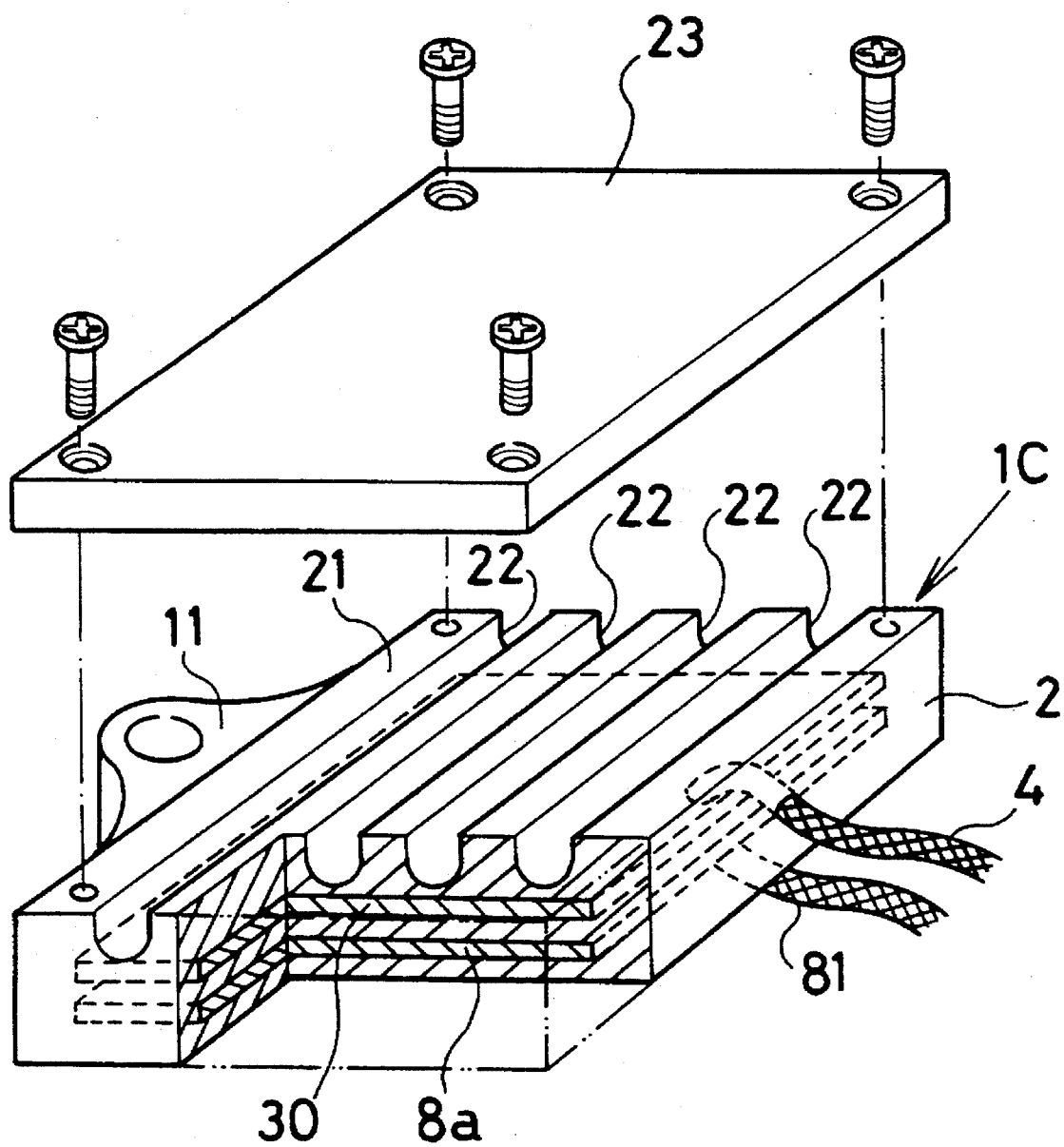
FIG. 7 is a view similar to FIG. 1 according to a fourth embodiment of the invention.

FIG. 7 shows a fourth embodiment of the invention in which a sparkplug voltage probe device 1C has an electrical shield sheet 8a embedded in the insulator base 2 of the second embodiment to be located under the electrode plate 30. The electrical shield sheet 8 is connected to the internal combustion engine (E) by way of the ground wire 81. It is observed that the electrical shield sheet may be in the form of meshes or layer.

With the use of the electrical shield sheet, it is possible to prevent capacitive variation between the electrode plate and the cables when some metallic conductor is present at the perimeter of the spark plug voltage probe device. This enables to precisely detect the voltage waveform from the voltage divider circuit.

FIG. 8 shows a fifth embodiment of the invention in which a sparkplug voltage probe device 1D has an insulator sheet 9 embedded in the insulator base 2. An electrode layer 91 is provided on an upper surface of the insulator sheet 9, while an electrical shield layer 92 is provided on a lower surface of the insulator sheet 9. The insulator sheet 9 may be made of vitreous material, epoxy resin or polyimide resin. With the use of the insulator sheet 9, the electrode layer 91 and the shield layer 92 are readily embedded in the insulator base 2. The use of the insulator sheet 9 makes it possible to reduce a thickness of the insulator base 2 as a whole.

Figure 9:
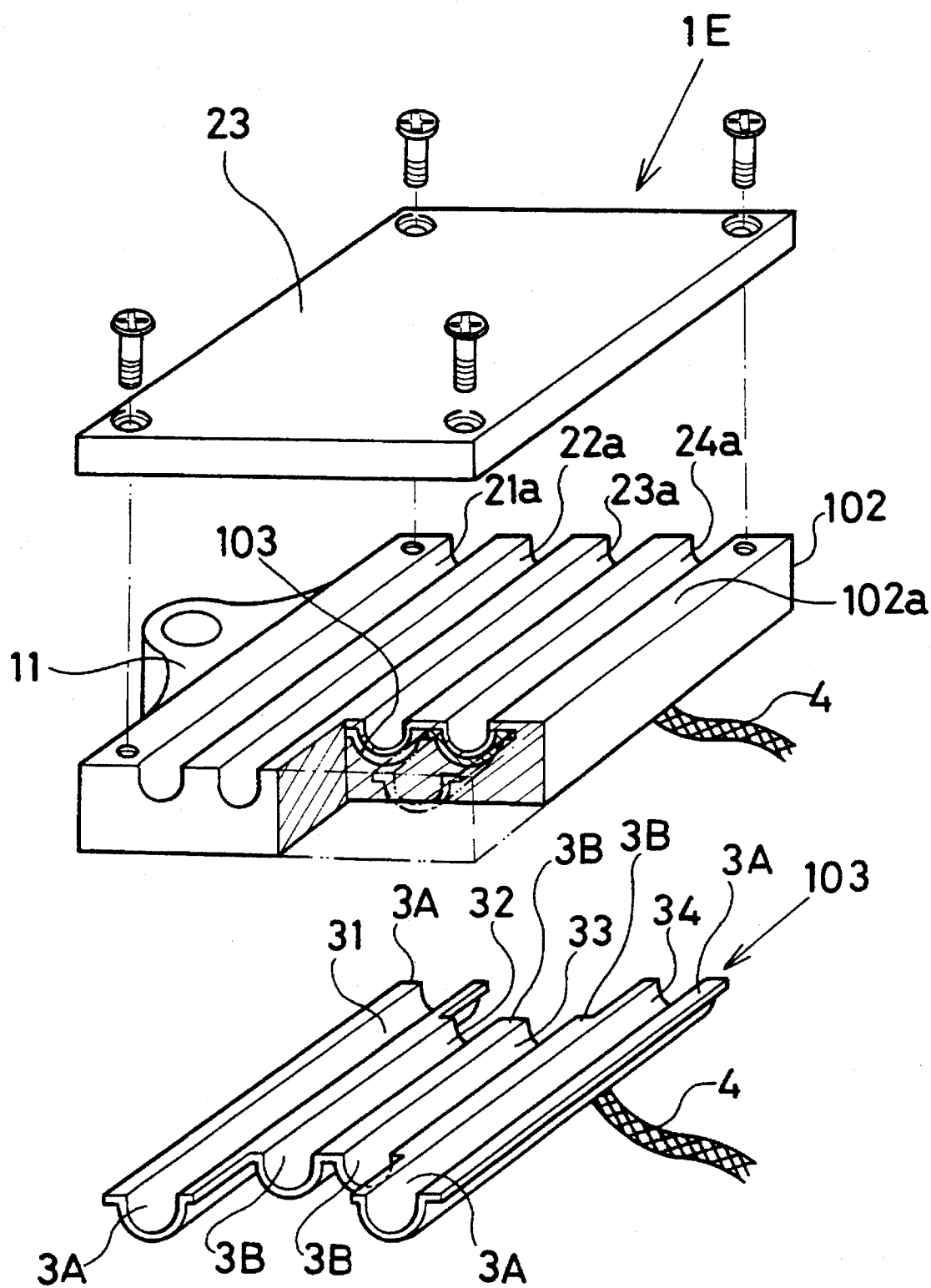
FIG. 9 is a view similar to FIG. 1 according to a sixth embodiment of the invention.

FIG. 9 shows a sixth embodiment of the invention in which a spark plug voltage probe device 1E has a rectangular insulator base 102, upper surface 102a of which has grooves 21a~24a at regular intervals in a longitudinal direction. Along the grooves 21a~24a, is an electrode plate 103 embedded in the insulator base 102 to form a static capacity between the electrode plate 103 and sparkplug cables 41~44 which are liquid-tightly placed in the corresponding grooves 21a~24a by way of an adhesive. The electrode plate 103 is in the form of corrugated configuration which has channels 31~34 corresponding to the grooves 21a~24a of insulator base 102.

Among the channels 31~34, longitudinal ends 3A, 3A of the outside channels 31, 34 are appropriately extended beyond longitudinal ends 3B, 3B of the inside channels 32, 33 respectively. Thereby, each length of outside channels 31, 34 is greater than that of the inside channels 32, 33 so as to substantially form an H-shaped configuration as a whole.

This enables to effectively compensate a capacitive shortage so that the static capacity between the cables 41, 44 and the outside channels 31, 34 is substantially equal to the static capacity between the cables 42, 43 and the inside channels 32, 33, thus making it possible to avoid a difference among the static capacity between each of the cables and the corresponding channels.

Figure 10:
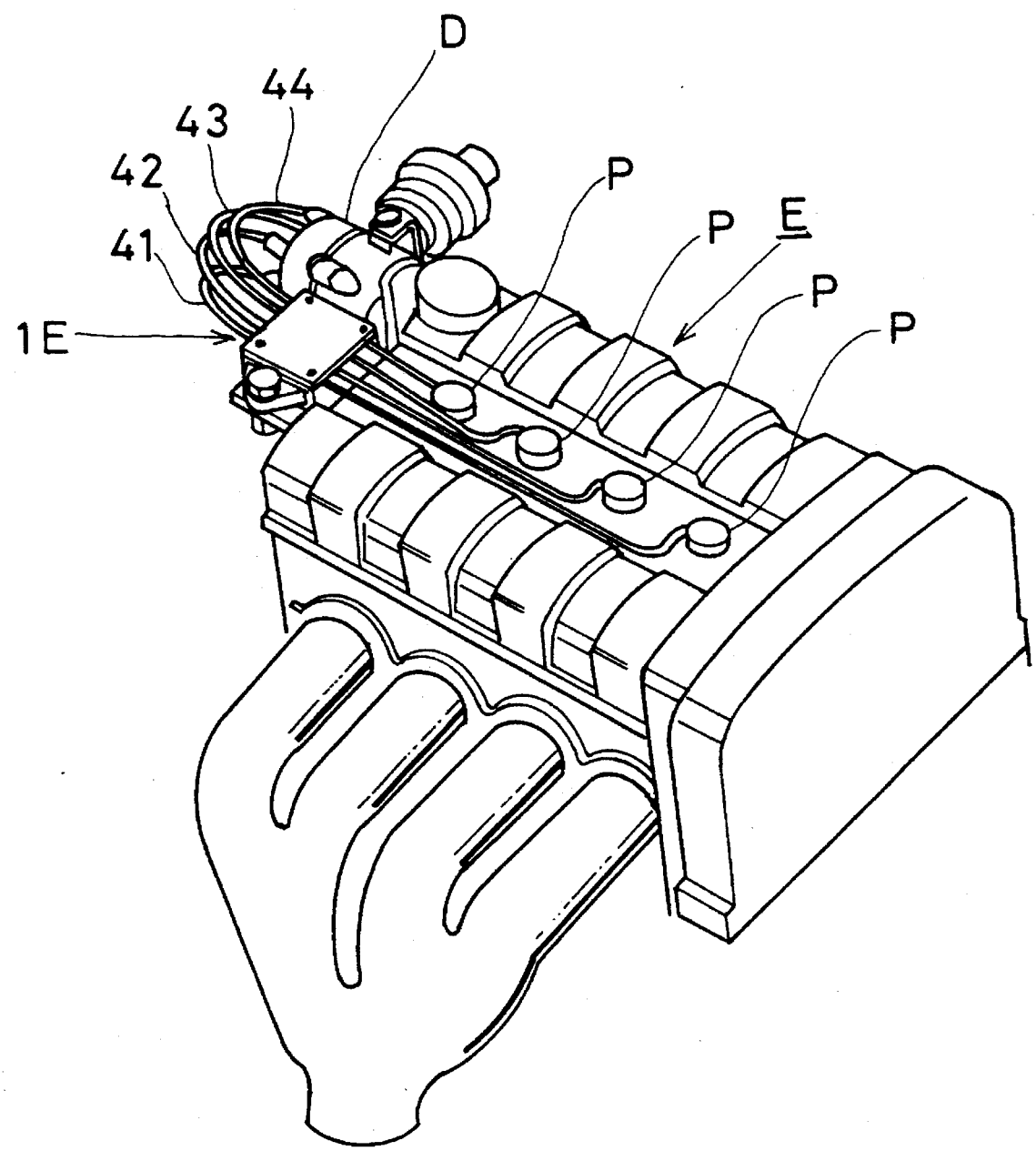
FIG. 10 is a view similar to FIG. 3 according to a sixth embodiment of the invention.

Then the lid 23 is fixed to the upper surface 102a of the insulator base 102 to secure the cables 41~44 against removal. The spark plug voltage probe device 1E is mounted on a cylinder head of the internal combustion engine (E), and introducing the cables 41~44 to the spark plugs (P) as shown in FIG. 10.

Figure 11:
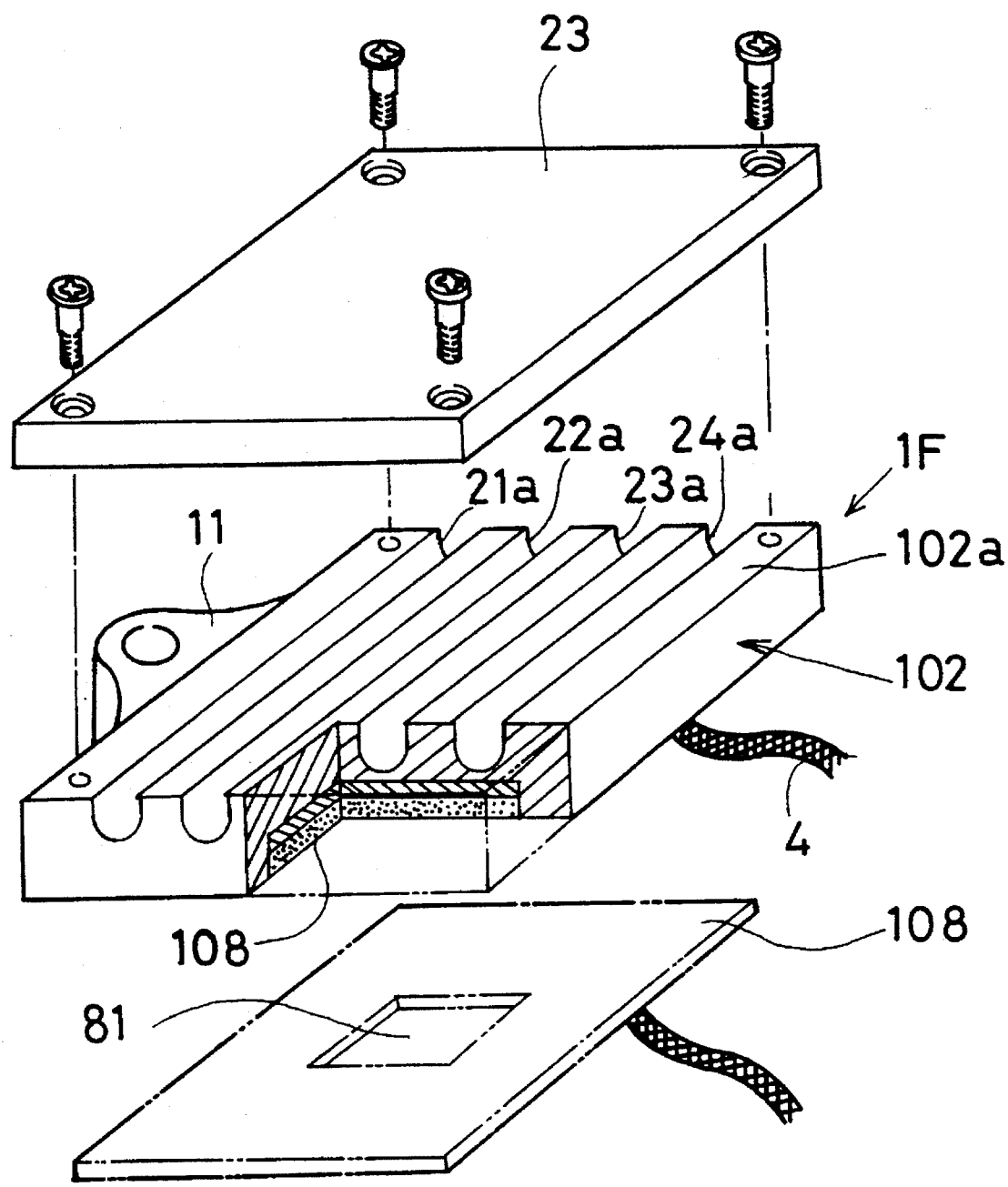
FIG. 11 is a view similar to FIG. 3 according to a seventh embodiment of the invention.

FIG. 11 shows a seventh embodiment of the invention in which a spark plug voltage probe device 1F has a rectangular flat sheet 108 as an electrode plate. The flat sheet 108 has a central opening 81 as a capacity adjusting means which works to decrease the static capacity between the cables 42, 43 and the flat sheet 108 so as to substantially achieve an uniform distribution between the cables 41~44 and the flat sheet 108.

Figure 12:
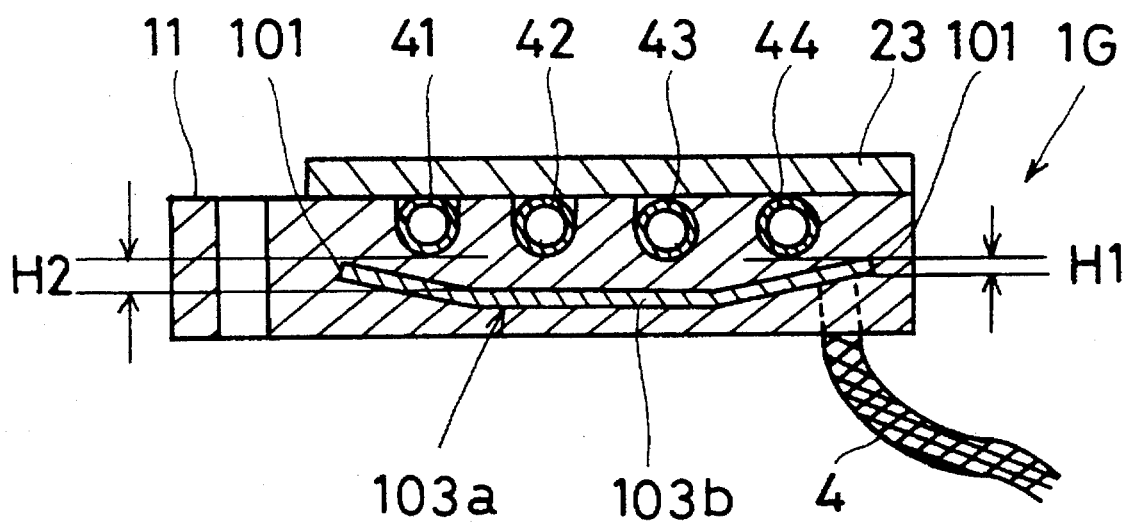
FIG. 12 is a longitudinal cross sectional view of a sparkplug voltage probe device according to an eighth embodiment of the invention.

FIG. 12 shows an eighth embodiment of the invention in which a spark plug voltage probe device 1G has a rectangular flat sheet 103a, both sides 101 of which turn upward to approach the cables 41, 44 so that a distance (H1) between the cables 41, 44 and the sides 101 is shorter than a distance (H2) between the cables 42, 43 and a central portion 103b of the sheet 103a.

Figure 13:
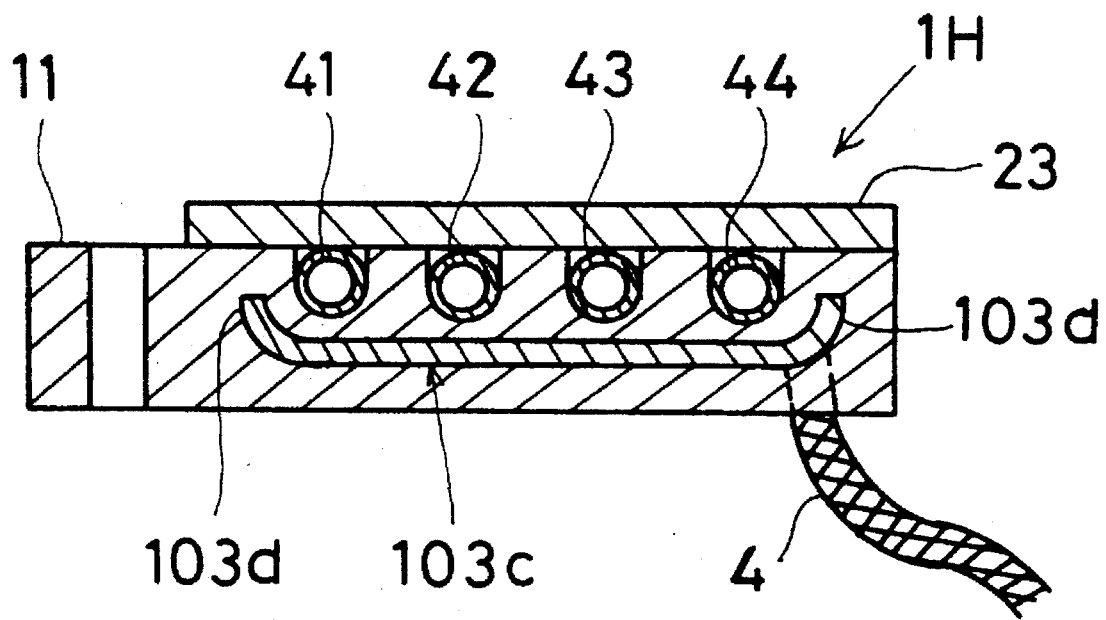
FIG. 13 is a view similar to FIG. 12 according to a ninth embodiment of the invention.

FIG. 13 shows a ninth embodiment of the invention in which a spark plug voltage probe device 1H has a rectangular flat sheet 103c, both sides 103d of which curl around the cables 41, 44 to form an arcuate configuration.

Figure 14:
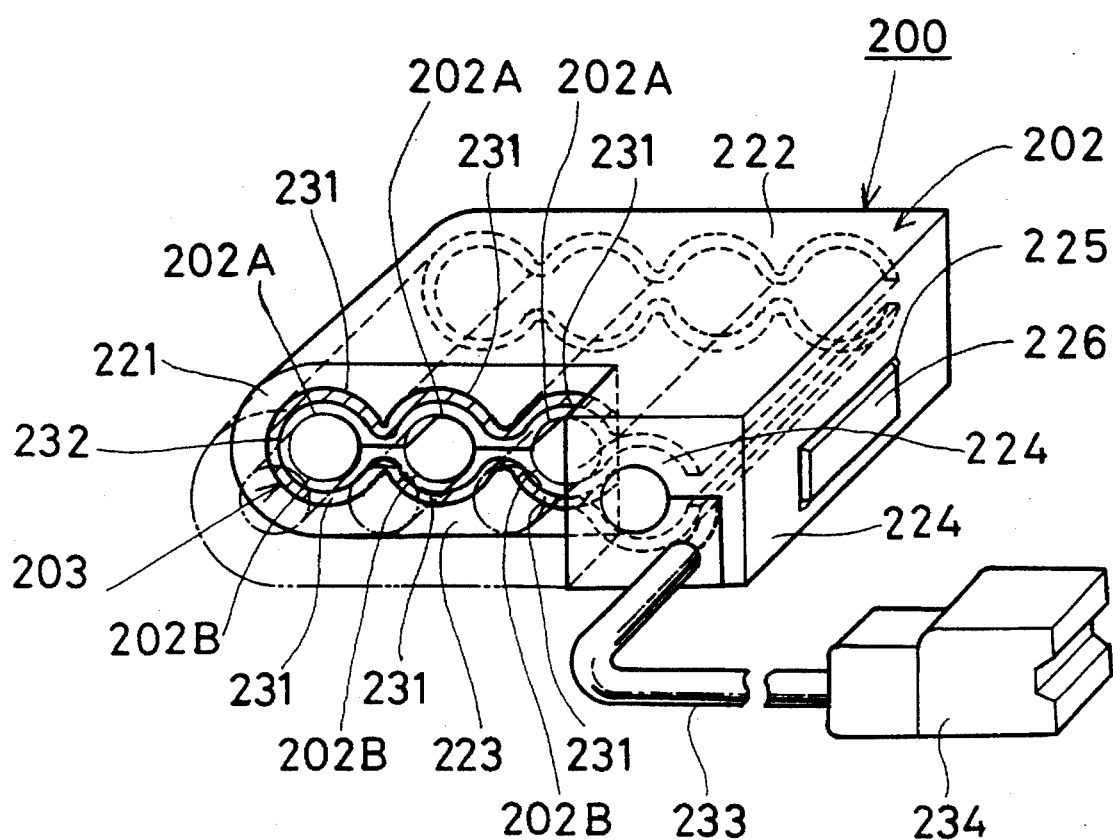
FIG. 14 is a perspective view of a sparkplug voltage probe device when an upper half and a lower half are in a folded position according to a tenth embodiment of the invention.
Figure 15:
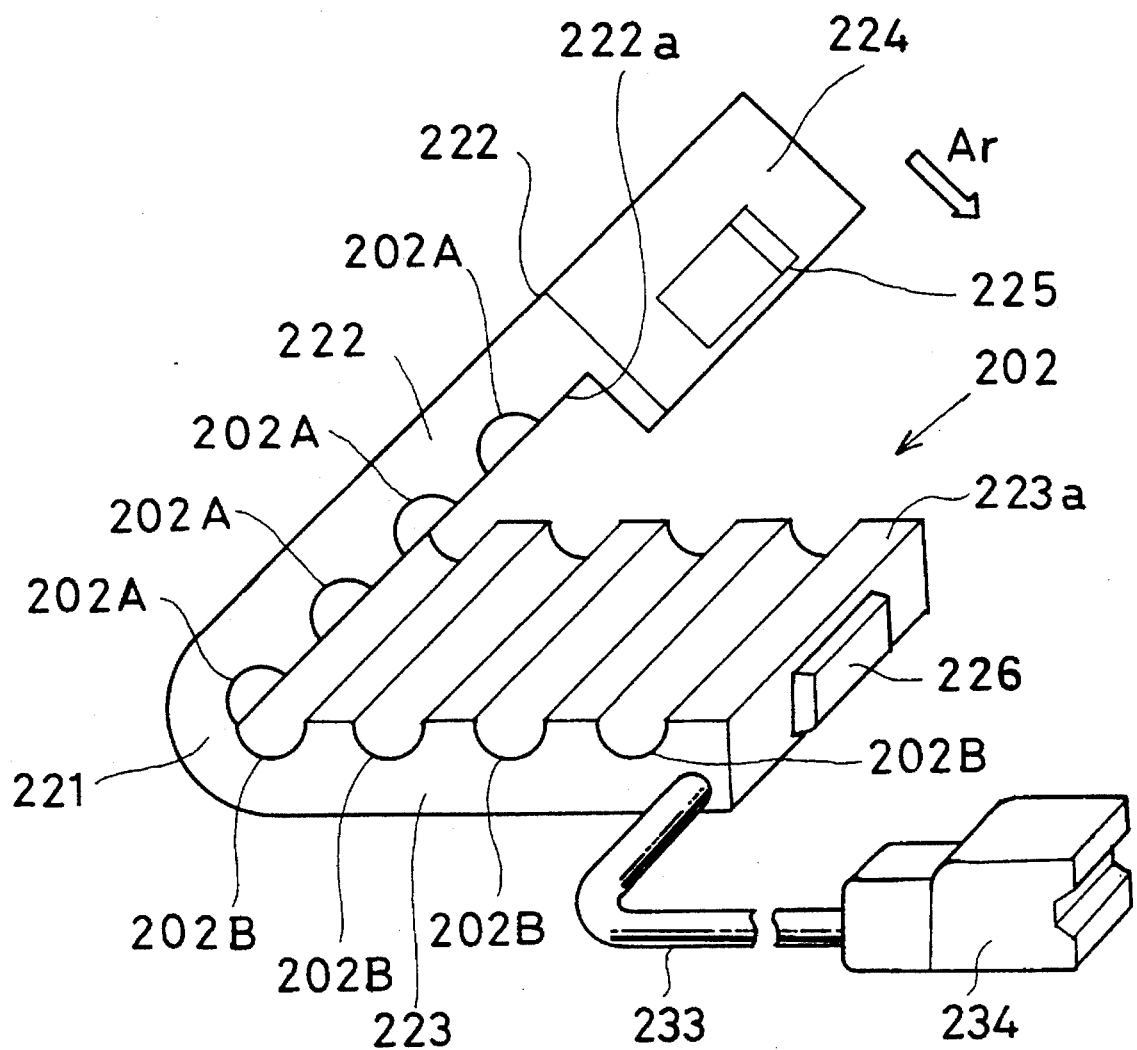
FIG. 15 is a perspective view of the sparkplug voltage probe device when an upper half and a lower half are in an open position.

Referring to FIGS. 14 and 15 which show a tenth embodiment of the invention, a sparkplug voltage probe device 200 has an insulator base 202 made of a rubber including an upper half 222 and a lower half 223 which are integrally connected by a flexible portion 221. On an upper surface 222a of the upper half 222, are grooves 202A provided at regular intervals. On an upper surface 223a of the lower half 223, are grooves 202B provided which corresponds to the grooves 202A. In the insulator base 202, is an electrode plate 232 embedded along the grooves 202A, 202B. The electrode plate 232 is in the form of corrugated configuration which has channels 231 in correspondence to the grooves 202A, 202B. The electrode plate 232 is connected to a connector 234 by way of a lead wire 233.

From an open position in which the upper half 222 is away from the lower half 223 as shown in FIG. 15, the upper half 222 is joined together around the flexible portion 221 in the direction of an arrow (Ar) to occupy a closed position in which the upper half 222 snugly placed on the lower half 223 as shown in FIG. 14. One end of the upper half 222 integrally carries an elastic plate 224 having an opening 225 which admits a protrusion 226 provided with one end of the lower half 223 to latch the upper half 222 in the closed position.

Figure 16:
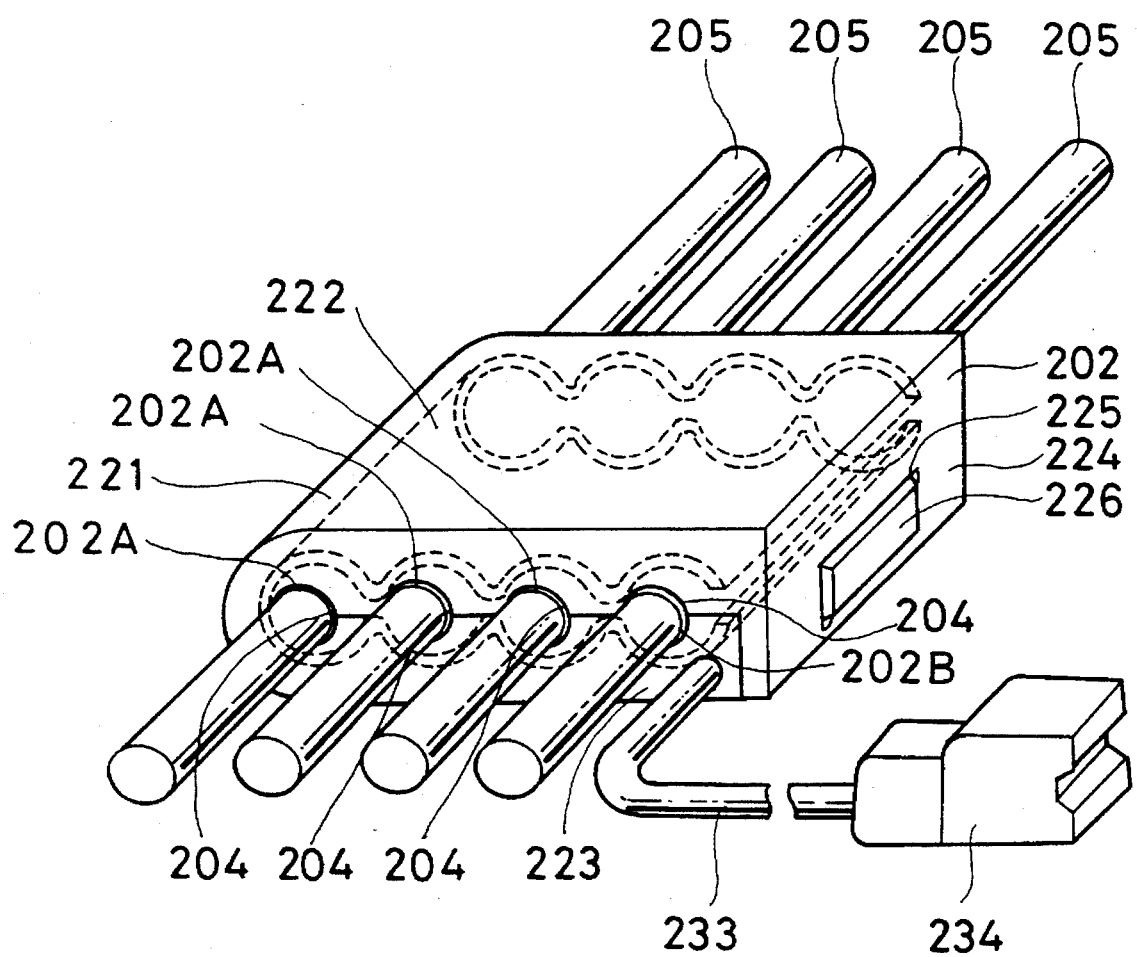
FIG. 16 is a perspective view of the sparkplug voltage probe device with sparkplug cables located in grooves.
Figure 17:
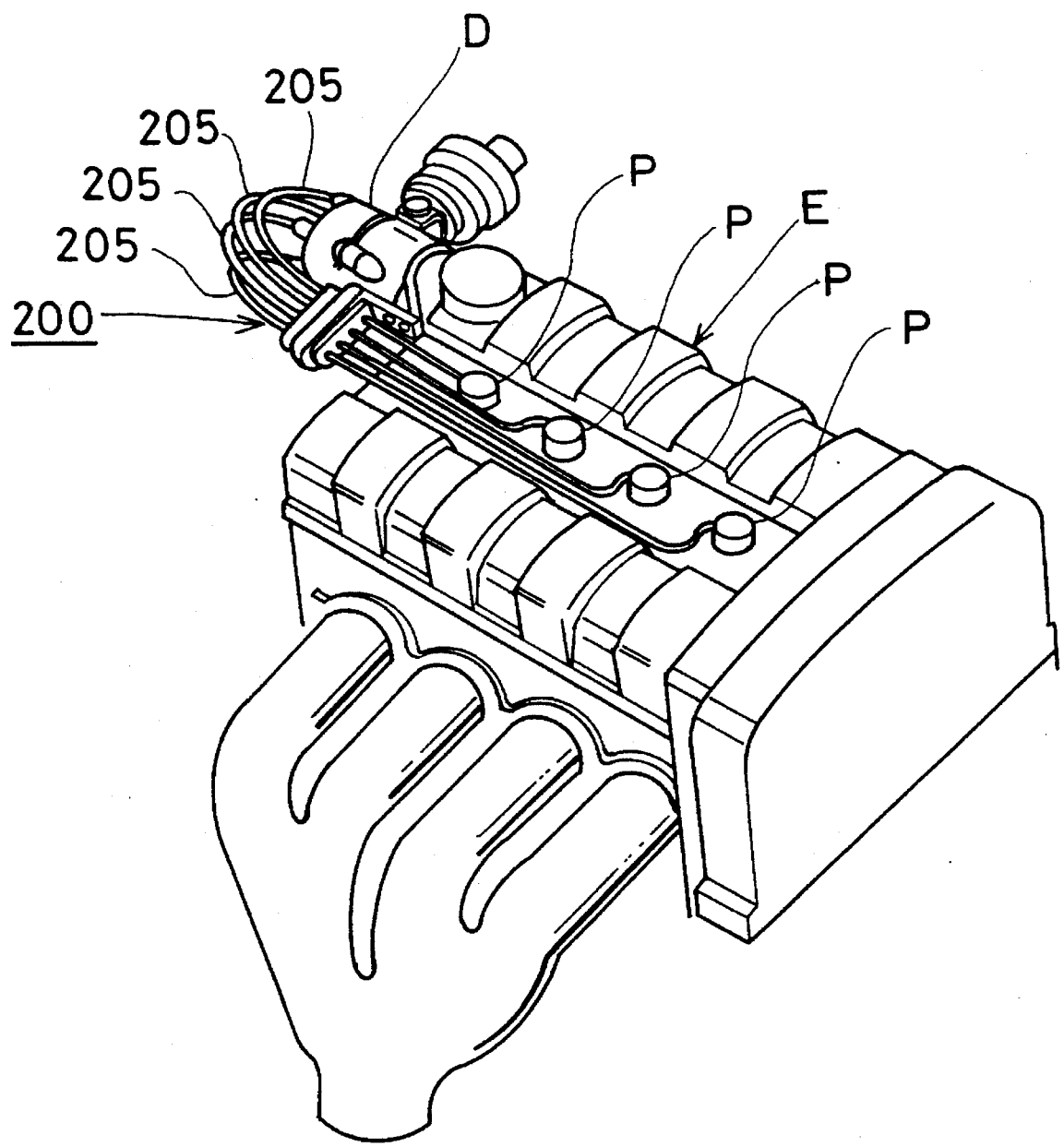
FIG. 17 is a view similar to FIG. 3.

During the process of moving the upper half 222 from the open position to the closed position, sparkplug cables 205 are liquid-tightly placed in the corresponding grooves 202A, 202B by way of an adhesive 204 as shown in FIG. 16. Then the sparkplug voltage probe device 200 is mounted on the internal combustion engine (E) to collect the cables 205 from the spark plugs (P) so as to introduce the cables 205 to the distributor (D) as shown in FIG. 17.

Figure 18:
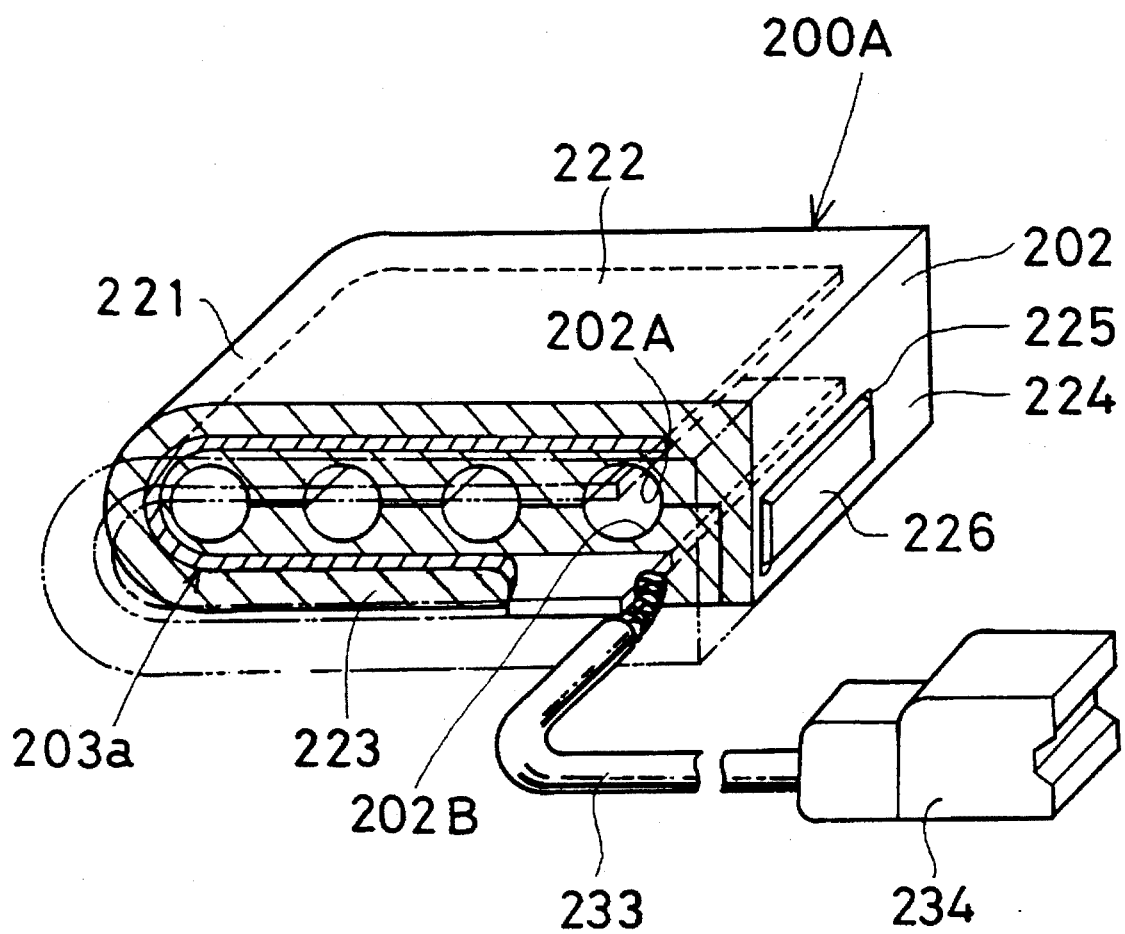
FIG. 18 is a perspective view similar to FIG. 14 according to an eleventh embodiment of the invention.

FIG. 18 shows an eleventh embodiment of the invention in which a spark plug voltage probe device 200A has a flat-shaped electrode plate 203a instead of the corrugated configuration.

Figure 19:
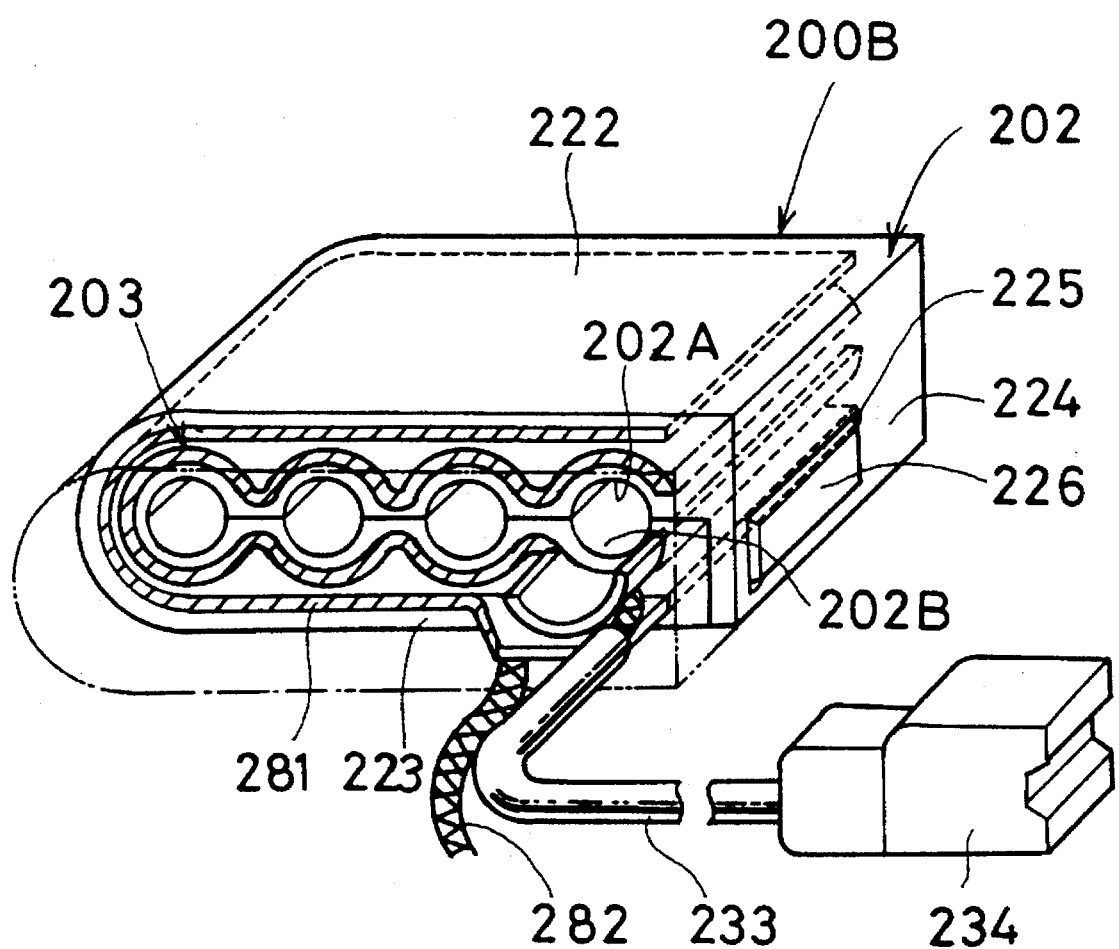
FIG. 19 is a perspective view similar to FIG. 14 according to a twelfth embodiment of the invention.

FIG. 19 shows a twelfth embodiment of the invention in which a spark plug voltage probe device 200B has an electrical shield sheet 281 embedded in the insulator base 202 along an electrode plate 203. The shield sheet 281 is connected to the internal combustion engine (E) by way of a ground wire 282 so as to equalize the potential level to the level of the internal combustion engine (E).

Figure 20:
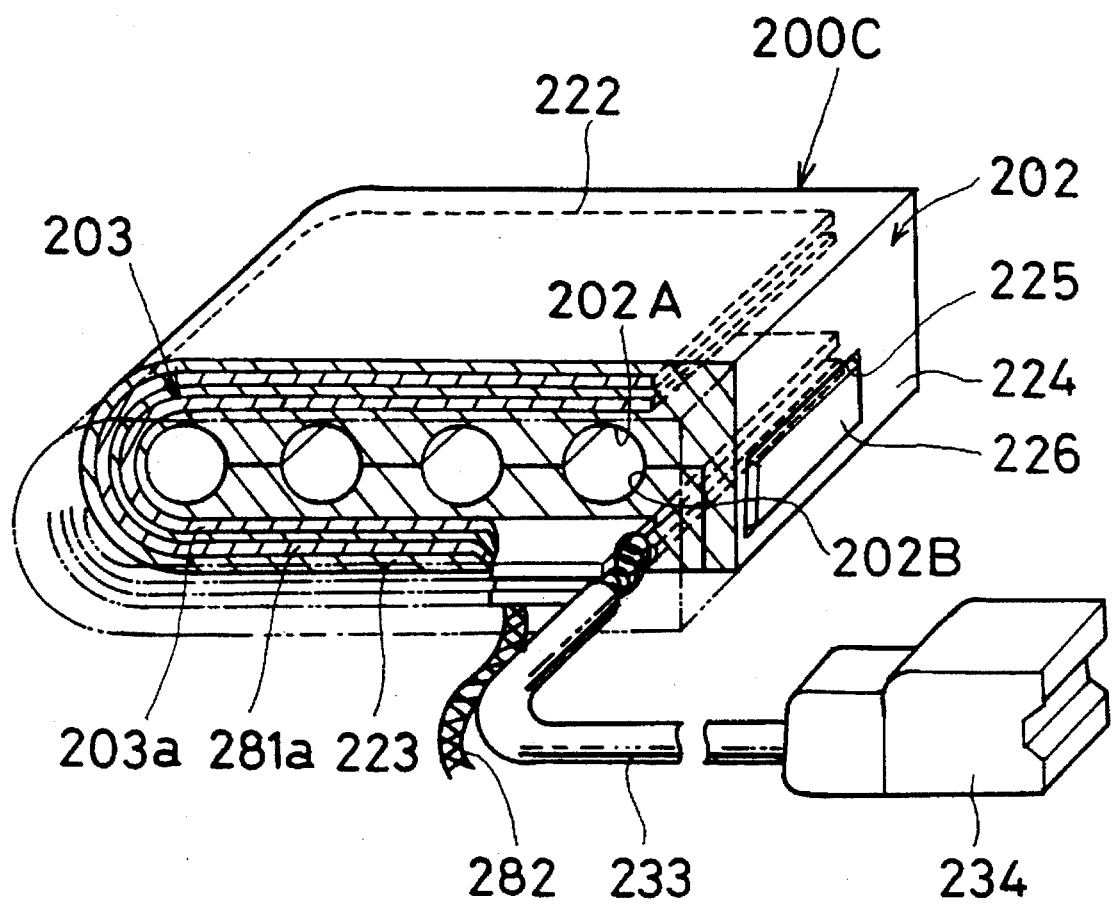
FIG. 20 is a perspective view similar to FIG. 14 according to a thirteenth embodiment of the invention.

FIG. 20 shows a thirteenth embodiment of the invention in which a spark plug voltage probe device 200C has an electrical shield sheet 281a embedded in an insulator base 202 along the electrode plate 203a.

Figure 21:
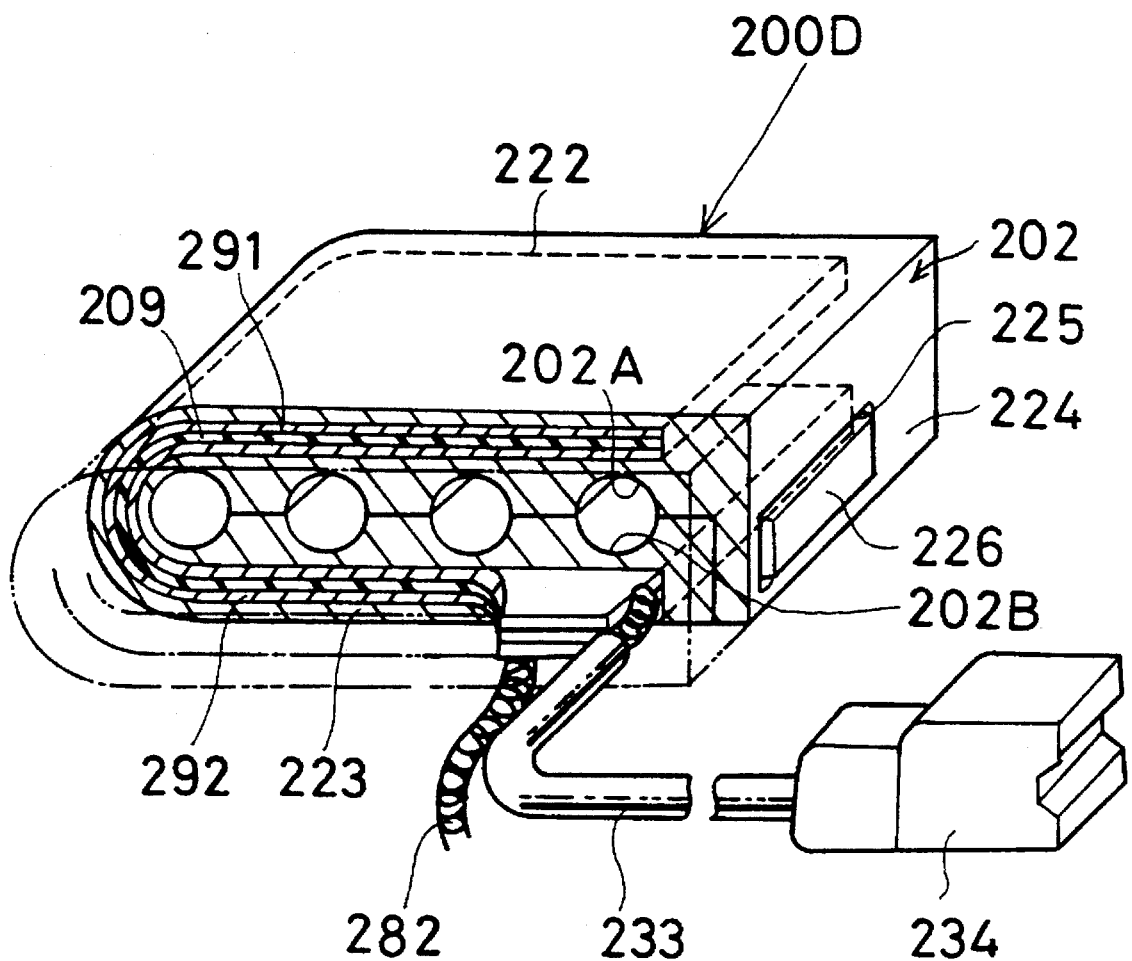
FIG. 21 is a perspective view similar to FIG. 14 according to a fourteenth embodiment of the invention.

FIG. 21 shows a fourteenth embodiment of the invention in which a spark plug voltage probe device 200D has an insulator sheet 209 made of a polyimide resin by way of example. An electrode layer 291 is provided on a lower surface of the insulator sheet 209, and an electrical shield layer 292 is provided on an upper surface of the insulator sheet 209. It is observed that the electrode layer 291 and the shield layer 292 may be an electrically conductive rubber or a metallic net of appropriate inch meshes.

Figure 22:
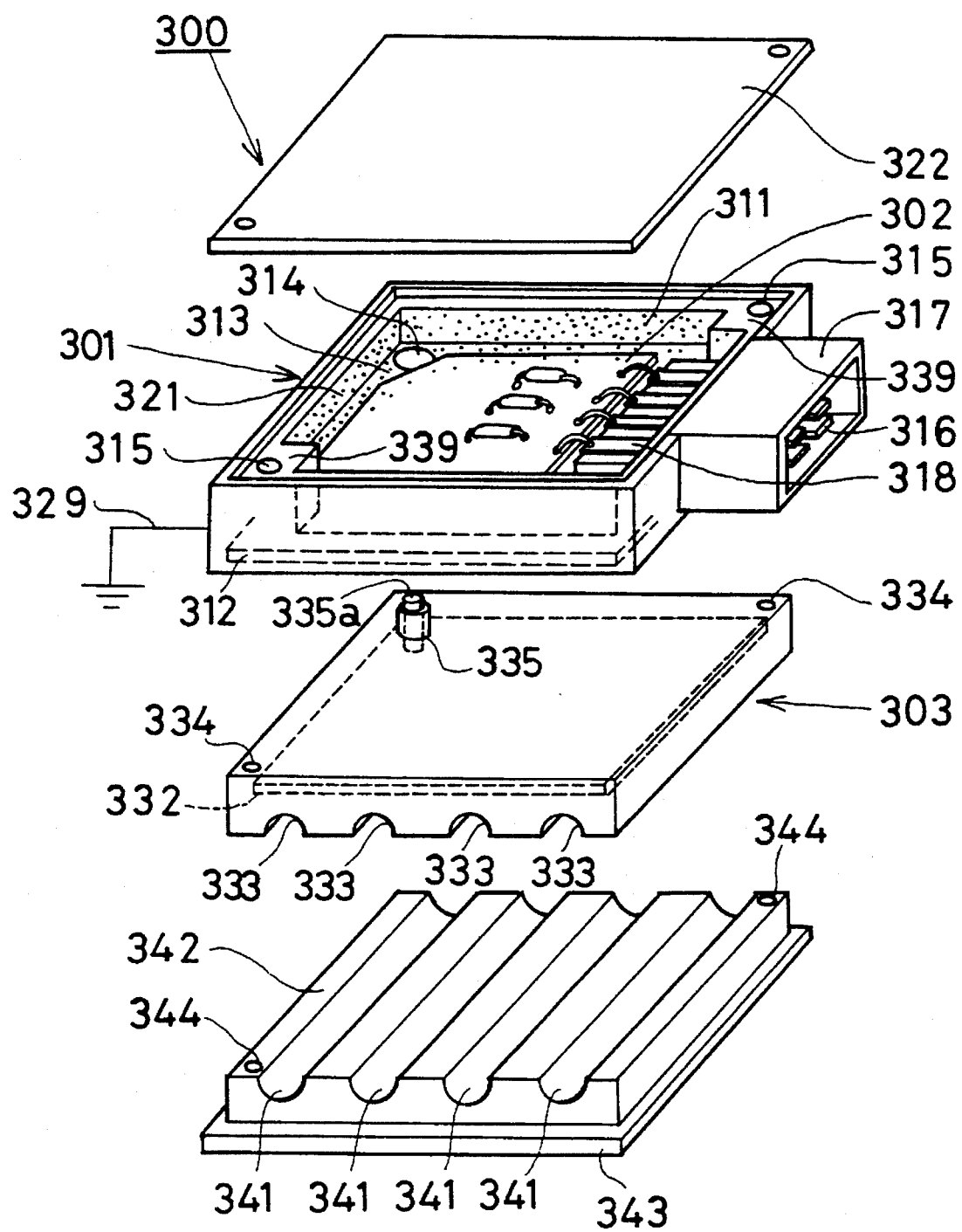
FIG. 22 is a perspective exploded view of a sparkplug voltage probe device according to a fifteenth embodiment of the invention.
Figure 23:
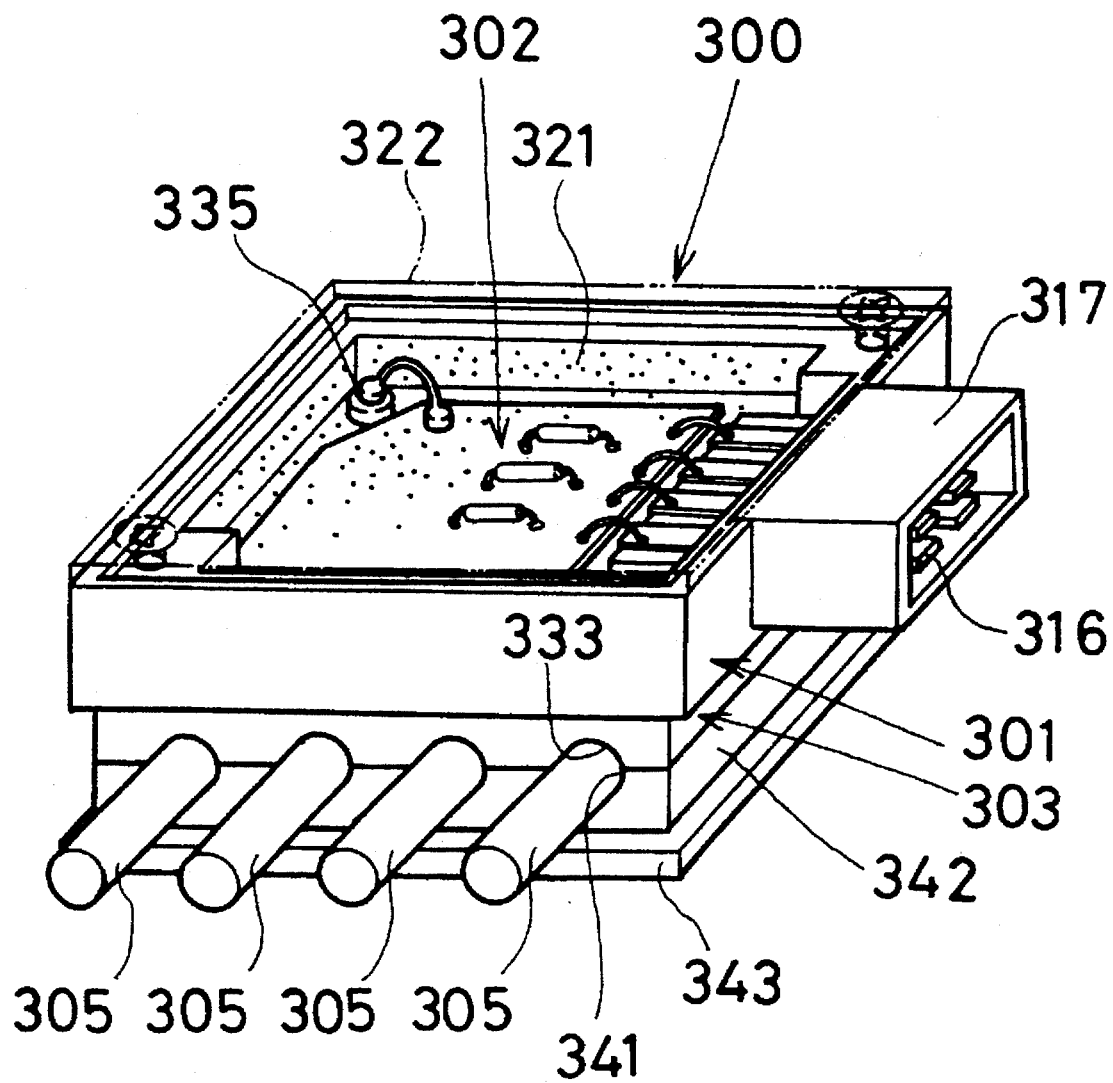
FIG. 23 is a perspective view of the sparkplug voltage probe device.

Referring to FIGS. 22 and 23 which show a fifteenth embodiment of the invention, a sparkplug voltage probe device 300 has a rectangular casing 301 made of aluminum so as to act as an electrical shield means. By means of an electrically conductive wall 313, an inner space of the casing 301 is partitioned into an upper space and a lower space. The upper space of the casing 301 serves as an accommodation room 311, while the lower space of the casing 301 serves as a recess 312. The electrically conductive wall 313 has a hole 314 which permits a passage of a lead wire 335a which is connected to an electrode plate 332 as described hereinafter.

The casing 301 is grounded by way of the electrically conductive wall 313 and a ground wire 329. A set of orthogonally opposed corners 339 of the casing 301 has screw tightening holes 315. To one side of the casing 301, is a connector 317 integrally attached which has lead pins 318 each connected to terminals 318 within the casing 301.

To the connector 317, is a lead cable connected which leads to a power source and an engine control device (not shown).

Within the accommodation room 311, is an electrical circuit board 302 placed which is connected to the corresponding terminals 318. Then the accommodation room 311 is filled with a silicone rubber 321, and closed by an aluminum lid 322. Within the recess 312, is an insulator base 303 placed which is made of rubber, but may be made of synthetic resin. The insulator base 303 is secured to the casing 301 by tightening screws through holes 334. On a lower surface of the insulator base 303, are grooves 333 provided, the number of which corresponds to that of the cylinders of the internal combustion engine (E). In the insulator base 303, is an electrode plate 332 embedded along the grooves 333. The electrode plate 332 is connected to the electrical circuit board 302 by the lead wire 335a which is introduced into the acommodation room 311 by way of a guide pipe 335.

To a lower surface of the insulator base 303, is a rubber plate 342 fixedly secured by tightening appropriate screws through a holes 344. On an upper surface of the rubber plate 342, are grooves 341 provided which corresponds to the grooves 333. To a lower surface of the rubber plate 342, is an electrical shield sheet 343 which is attached by means of an adhesive so as to serve as a conductor wall.

Within each pair of the grooves 333, 341, is a spark plug cable 305 liquid-tightly placed to form a static capacity between the electrode plate 332 and the cables 305 as shown in FIG. 23.

Figure 24:
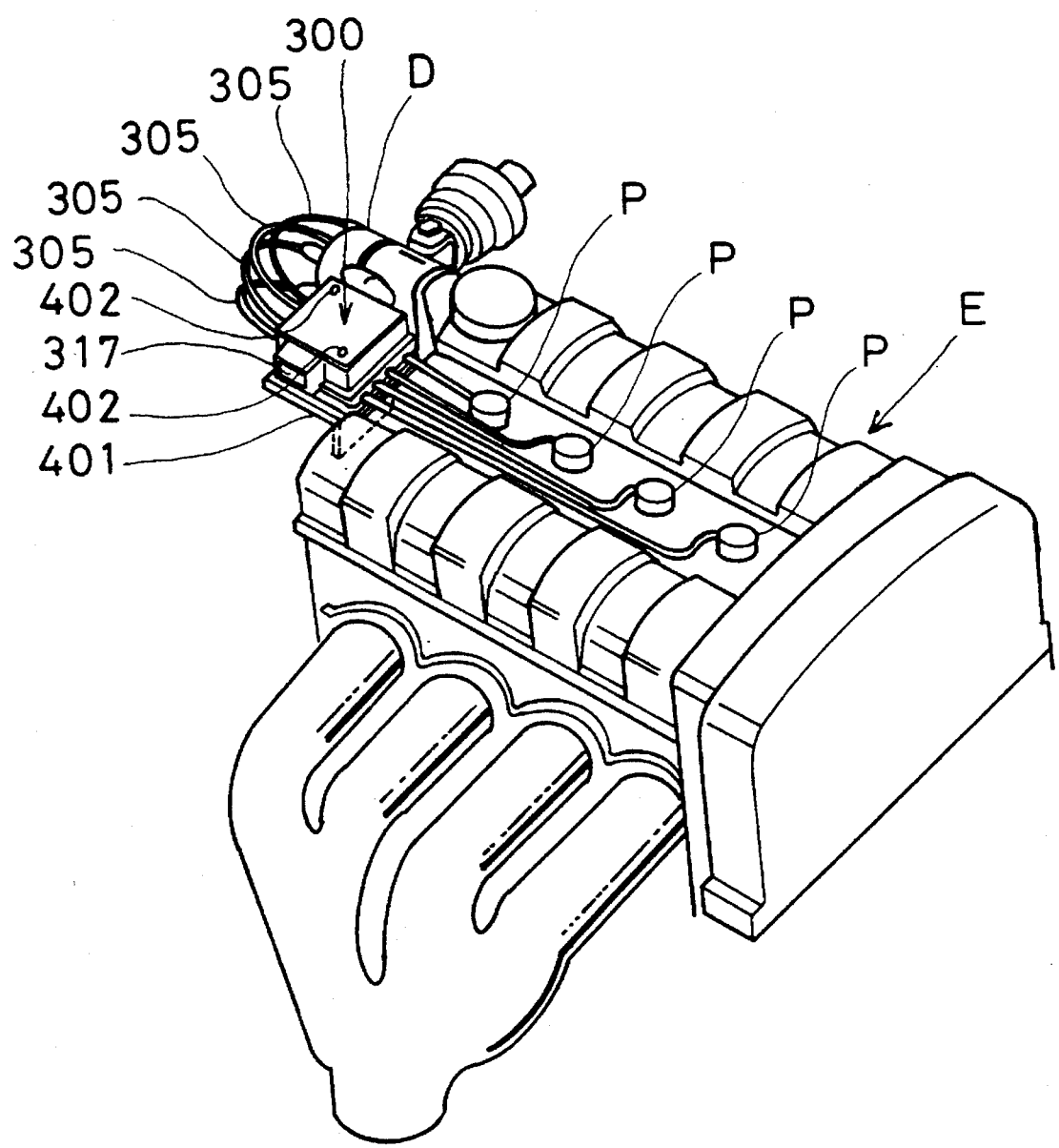
FIG. 24 is a perspective view with the sparkplug voltage probe device mounted on an internal combustion engine.

The sparkplug voltage probe device 300, thus assembled, is mounted on the internal combustion engine (E) by tightening bolts 402 to a bracket 401, and connecting the distributor (D) to the spark plugs (P) by way of the cables 305 as shown in FIG. 24.

According to the invention, a static capacity (C2) is formed between the electrically conductive wall 313 and the electrode plate 332, and the static capacity (C2) is greater than the static capacity (C1) formed between the electrode plate 332 and the cables 305. The noise is reduced by the ratio of C1/C2 so as to prevent a signal (S) from being inadvertently disturbed when the noise is caused from a capacitive discharge component of the sparkplug voltage.

The circuit board 302 is accommodated in the electrical shield casing 301 so that the circuit board 302 is protected against disturbance of electromagnetic wave due to the ignition system.

Since the electrode plate 332 is protected by the electrically conductive wall 313 and the electrical shield sheet 343, the electrode plate 332 is hardly affected by the electromagnetic noise (N) due to the perimeter parts of the internal combustion engine (E), thus reducing the ratio of N/S to precisely detect a burning condition in the internal combustion engine (E).

It is noted that the casing 301 may be made of synthetic resin, an inner side wall of which is coated with metallic layer, otherwise the casing 301 may be made of synthetic resin in which a metallic sheet is embedded.

It is also noted that the electrode plate 332 may be corrugated sheet which has channels corresponding to the grooves 333.

It is appreciated that the electrical sheet 343 may be made in integral with the bracket 401.

While the invention has been described with reference to the specific embodiments, it is understood that this description is not to be construed in a limiting sense in as much as various modifications and additions to the specific embodiments may be made by skilled in the artisan without departing from the spirit and scope of the invention.

What is claimed is:

1. In a snap-in type spark plug voltage probe device which detects a voltage applied to each spark plugs installed in an internal combustion engine by way of spark plug cables so as to analyze a burning condition in the internal combustion engine on the basis of the voltage applied to each of the spark plugs;

the snap-in type spark plug voltage probe device comprising:

an insulator base including an upper half and a lower half, both ends of which are integrally connected by means of a flexible portion, and each of the upper half and the lower half having a plurality of grooves in which the spark plug cables are placed when the upper half and the lower half are joined together around the flexible portion to occupy a closed position;

the upper half having an opening which admits an entry of a protrusion which is provided with the lower half of the insulator base to maintain the upper half and the lower half in the closed position;

an electrode layer embedded in the upper half and the lower half of the insulator base along the grooves to form a static capacity between the electrode layer and the spark plug cables when the voltage is applied across the spark plugs;

a lead wire provided to electrically connect the electrode layer to a microcomputer so as to analyze the burning condition based on the static capacity between the electrode layer and the spark plug cables; and an electrical shield layer embedded in the insulator base in the proximity of the electrode layer, and located at a side of the electrode layer remote from the grooves so as to electrically shield the electrode layer, the electrical shield layer being connected to the internal combustion engine by way of a ground wire.

2. A snap-in type spark plug voltage probe device in accordance with claim 1 wherein an adhesive is provided between the upper half and the lower half of the insulator base to prevent entry of water into the interface between the upper half and the lower half of the insulator base.

3. A snap-in type spark plug voltage probe device in accordance with claim 2 wherein an insulator sheet is embedded in the insulator base located between the electrode layer and the electrical shield layer.

4. A snap-in type spark plug voltage probe device in accordance with claim 1 wherein an insulator sheet is embedded in the insulator base located between the electrode layer and the electrical shield layer.

5. A snap-in type spark plug voltage probe device in accordance with claim 4 wherein the insulator sheet is made of a polyamide resin.

6. A snap-in type spark plug voltage probe device in accordance with claim 4 wherein the electrical shield sheet is mesh-form.

* * * * *